US011211103B1

(12) United States Patent
Mazumder et al.

(10) Patent No.: US 11,211,103 B1
(45) Date of Patent: Dec. 28, 2021

(54) BURST CLOCK CONTROL BASED ON PARTIAL COMMAND DECODING IN A MEMORY DEVICE

(71) Applicant: Micron Technology, Inc., Boise, ID (US)

(72) Inventors: Kallol Mazumder, Dallas, TX (US); Takayuki Miyamoto, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/996,025

(22) Filed: Aug. 18, 2020

(51) Int. Cl.
*G11C 7/22* (2006.01)
*G06F 13/28* (2006.01)
*G11C 7/10* (2006.01)
*G06F 1/12* (2006.01)
*G06F 1/08* (2006.01)

(52) U.S. Cl.
CPC ............ *G11C 7/222* (2013.01); *G06F 1/08* (2013.01); *G06F 1/12* (2013.01); *G06F 13/28* (2013.01); *G11C 7/1039* (2013.01)

(58) Field of Classification Search
CPC ....... G11C 7/222; G11C 7/1039; G06F 13/28; G06F 1/12; G06F 1/08
See application file for complete search history.

(56) References Cited

U.S. PATENT DOCUMENTS

| 2008/0025457 A1* | 1/2008 | Pyeon | H03K 21/38 377/118 |
| 2012/0113728 A1* | 5/2012 | Kwon | G11C 7/1087 365/189.05 |
| 2020/0135257 A1* | 4/2020 | Miyano | H03L 7/0814 |

\* cited by examiner

*Primary Examiner* — Ajay Ojha
(74) *Attorney, Agent, or Firm* — Fletcher Yoder, P.C.

(57) ABSTRACT

Devices and methods include a command input configured to receive a command for a memory device. Second stage wakeup circuitry configured to receive a portion of the command and output an indication of whether the command is a non-burst command based on the portion. Clock gating circuitry is configured to receive an input clock and a wake signal. The clock gating circuitry is also configured to output an internal clock based at least in part on a pulse of the received wake signal. The clock gating circuitry also is configured to maintain the output of the internal clock for a duration based on the indication with the duration being shorter when the indication indicates that the command is a non-burst command.

20 Claims, 5 Drawing Sheets

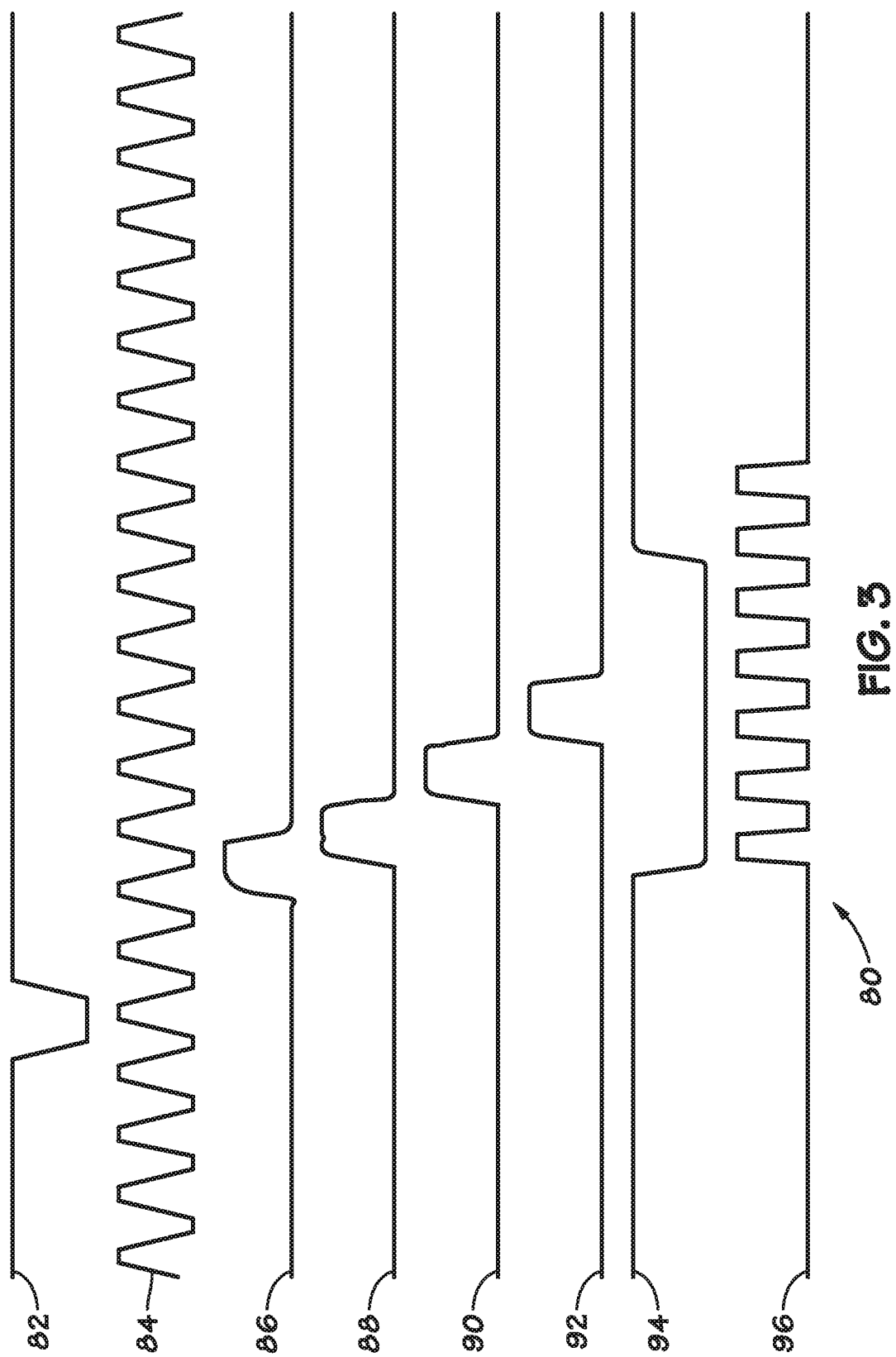

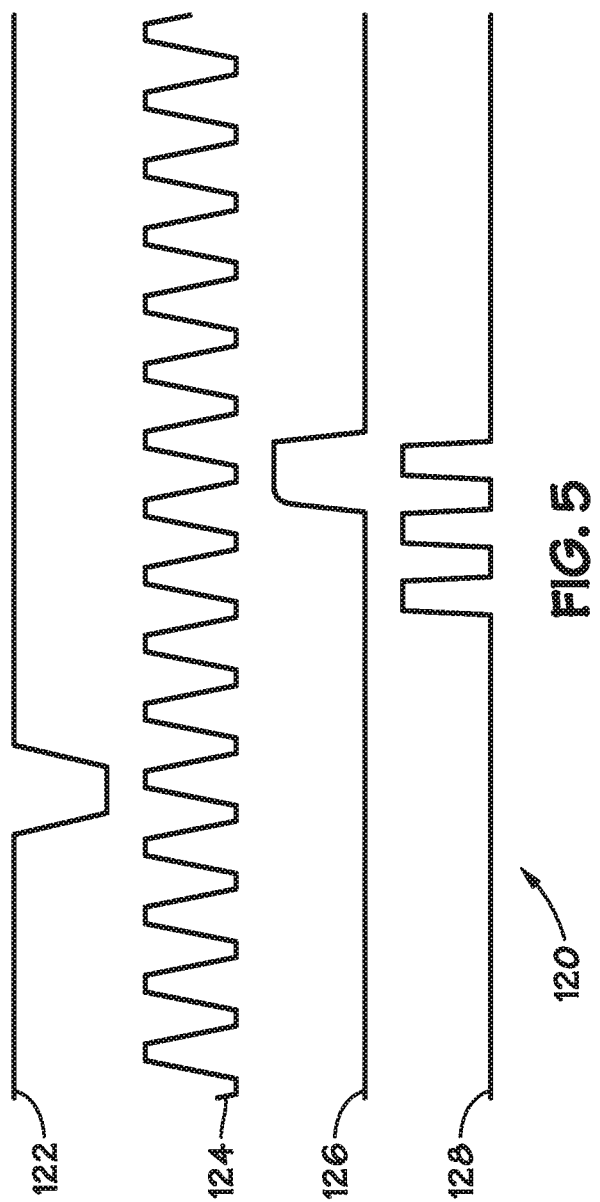

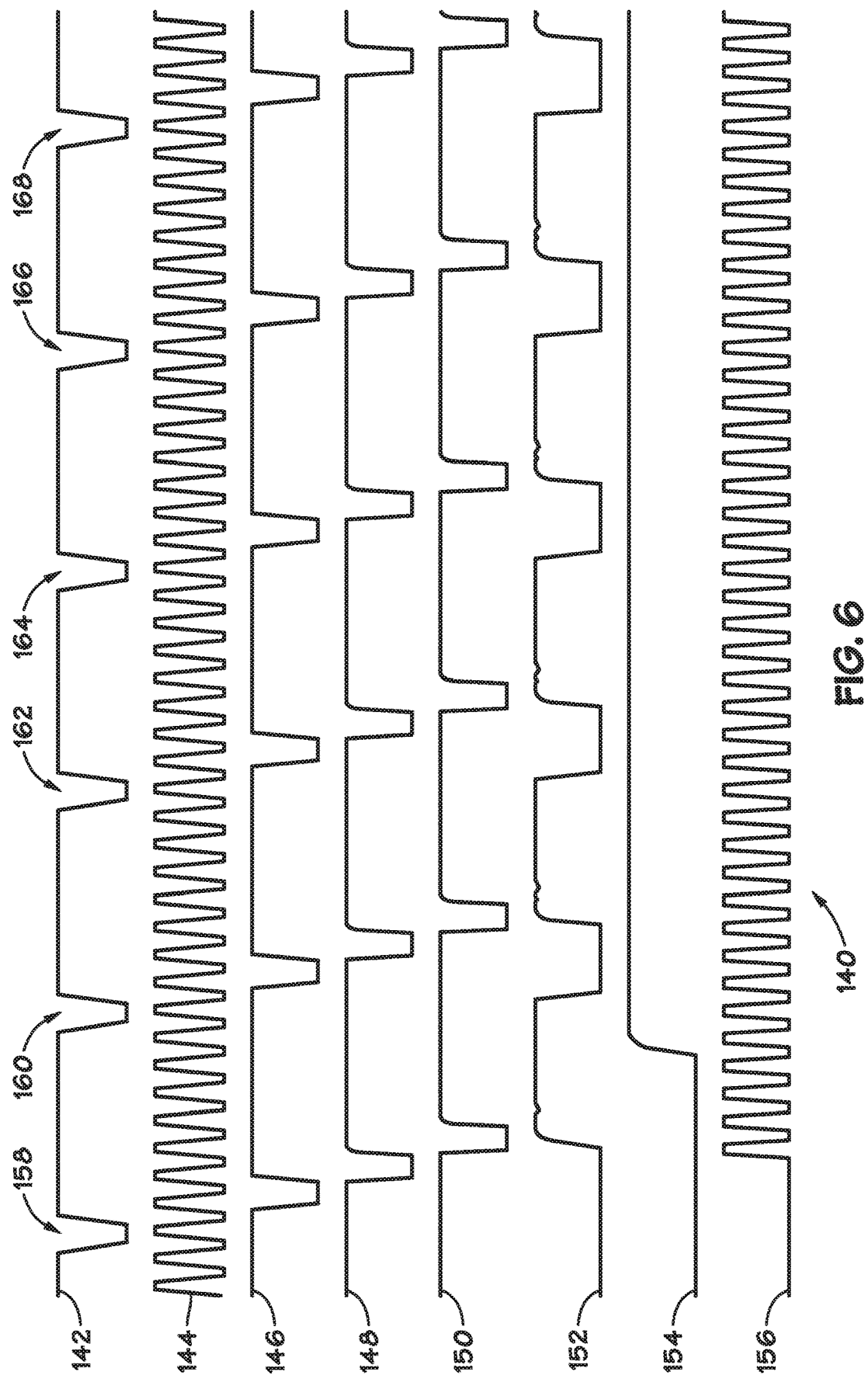

BURST CLOCK CONTROL BASED ON PARTIAL COMMAND DECODING IN A MEMORY DEVICE

BACKGROUND

Field of the Present Disclosure

Embodiments of the present disclosure relate generally to the field of memory devices. More specifically, embodiments of the present disclosure relate to using a part of a command to control a burst clock for the memory device.

Description of Related Art

When a wake signal (e.g., a chip select (CS) signal) is received at a memory device, the memory device may awaken a command burst clock. The memory device may keep the command burst clock running until a maintain signal is fed back from a command/control logic area. However, this maintain signal may take a relatively long time to return due to various factors. For example, the command may span multiple cycles causing delay in propagation and decoding of the entire command. Furthermore, various different modes such as gear down or power down modes may complicate the decoding. The memory device may not distinguish between burst commands that utilize the burst clock (e.g., read (READ) and write (WRITE) commands of various types) and non-burst commands that do not utilize the burst clock (e.g., activate (ACT) or precharge (PRE) commands). Since the memory device does not know whether the command may need the burst clock, the memory device may enable the burst clock for an entire duration from receiving the signal until the maintain signal is fed back from the command/control logic. However, since many commands may not need the burst clock, keeping the burst clock alive may consume more power than is useful in performing the non-burst commands thereby reducing the overall power efficiency of the memory device.

Embodiments of the present disclosure may be directed to one or more of the problems set forth above.

BRIEF DESCRIPTION OF DRAWINGS

FIG. 3 is a timing diagram of example signals that may be used in the burst clock circuitry of FIG. 2, according to an embodiment of the present disclosure;

FIG. 5 is a timing diagram of example signals that may be used in the clock circuitry of FIG. 4 for a non-burst command, according to an embodiment of the present disclosure; and FIG. 6 is a timing diagram of example signals that may be used in the clock circuitry of FIG. 4 for a burst command, according to an embodiment of the present disclosure.

DETAILED DESCRIPTION

Figure 1:
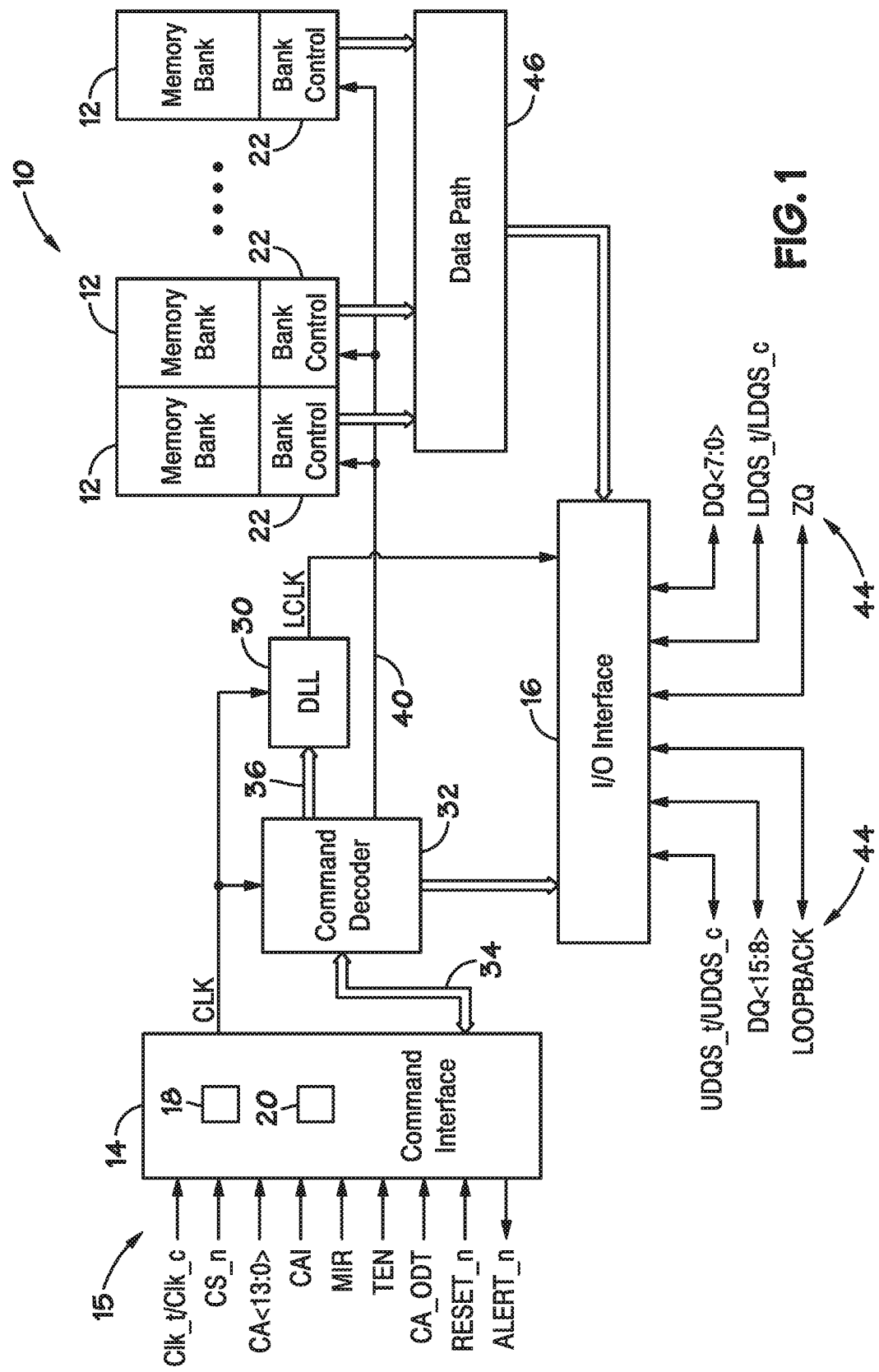
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, memory devices may use certain signals (e.g., chip select (CS) signals) to wake up certain aspects of the memory device, such as clock propagation. This wake up may be held until the received command is decoded, propagated through at least a portion of a command pipeline, and returned to the clock gating circuitry. However, a scheme based entirely on this signal may not distinguish between a burst command using a burst clock and a non-burst command that does not use a burst clock. Accordingly, the burst clock may be held on for both burst and non-burst commands until an entire command is decoded after transmission through the pipeline. However, the burst clock running during non-burst commands may waste power as non-burst commands may be frequently utilized in the memory device. Instead, a two-stage scheme may be deployed that utilizes the signal for an initial wake up for a duration shorter than is necessary to propagate an entire command through the pipeline and to decode it. Instead, a shorter wake up may be used while a secondary keep awake analysis is made based on a portion (e.g., a first cycle) of the command. For instance, burst commands may have a first common value (e.g., 1-0) for a number (e.g., 2) of bits in a portion (e.g., a first cycle) of a command or non-burst commands may have a second common value for a number of bits in the portion of the command. This portion of the command may be read without waiting for the complete command or for propagation through the command pipeline. Instead, a command interface/clock input may look at a portion of the partial command and determine whether the command is likely to be a burst command or a non-burst command. Based on a determination of the incoming command being from a subset of commands including a burst command, the memory device may apply a secondary keep awake process that keeps propagating the clock until a maintain signal may be received from the command pipeline. However, if the incoming command is from a subset of commands including only non-burst commands, the memory device may cease propagation of the clock after the initial duration rather than waiting until a maintain signal may be received from the command pipeline. This lower number of default pulses on the burst clock and earlier disabling of the clock propagation in the process may reduce power consumption of the memory device due to unnecessary clock propagation in non-burst commands.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates an internal clock signal LCLK based on the received internal clock signal CLK. The internal clock signal LCLK is supplied to the I/O interface 16, for instance, and is used as a timing signal for determining an output timing of read data. The clock input circuit 18 may also include gating circuitry that is configured to gate the propagation of the received clock to the internal clock to prevent moving voltages of capacitors in the memory device 10 and consuming power. Thus, unless the internal clock is to be used, the clock input circuit 18 may utilize clock gating to block propagation of the internal clock.

The internal clock signal(s) CLK, when propagated, may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the internal clock signal LCLK. The internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_b), the DQS signals may be provided as a differential pair of data strobe signals (DQS_t/and DQS_b) to provide differential pair signaling during reads and writes. For certain memory devices, such as a DDR5 SDRAM memory device, the differential pairs of DQS signals may be divided into upper and lower data strobe signals (e.g., UDQS_t/and UDQS_b; LDQS_t/and LDQS_b) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
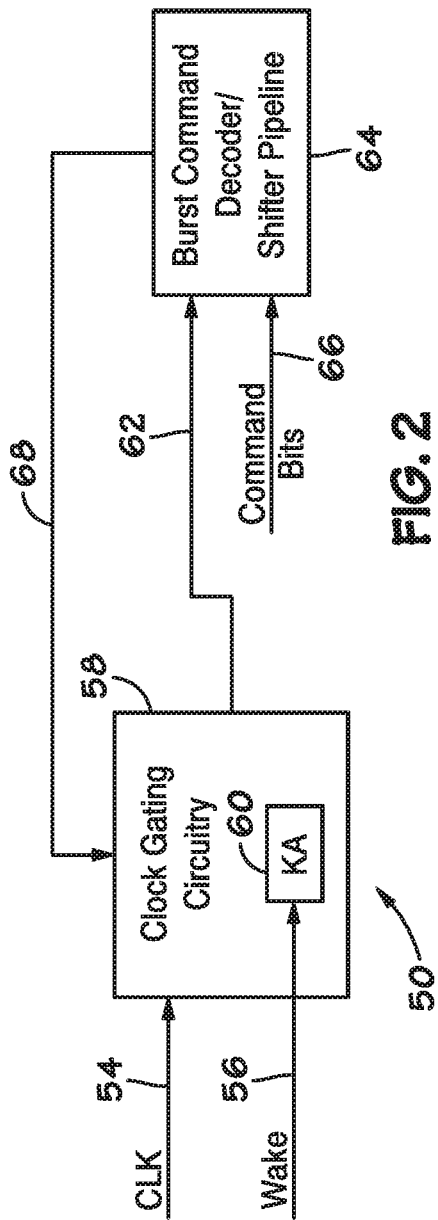
FIG. 2 is a block diagram view of clock circuitry used to gate a burst clock in the memory device of FIG. 1, according to an embodiment of the present disclosure.

FIG. 2 is a block diagram of clock control circuitry 50 that may be implemented in the command interface 14, the command decoder 32, and/or the command bus 34. As illustrated, the clock control circuitry 50 receives a clock 54 and a wake signal 56 at clock gating circuitry 58. The clock 54 may be the Clk_t or Clk_c received at the command interface 14 in FIG. 1. The wake signal 56 may include any signals received at the command interface 14. For instance, the wake signal 56 may be a particular CS_n signal (e.g., high or low) received from an external device (e.g., a host processor) for a particular chip of the memory device 10 being selected.

The clock gating circuitry 58 may be located in and/or near the clock input circuit 18 and used to stop unnecessary propagation of an internal clock 62 (e.g., during a non-burst command). The internal clock 62 may be the internal clock illustrated in FIG. 1 that is transmitted from the command interface 14 to the command decoder 32 and the DLL circuit 30. The clock gating circuitry 58 may receive the clock 54 as a raw clock and may prevent propagation of the clock 54 as the internal clock 62 until the wake signal 56 is received.

After the wake signal 56 is received, the clock gating circuitry 58 propagates the clock 54 as the internal clock 62 for a period of time. The period of time is set by keep awake circuitry 60. The keep awake circuitry 60 keeps the clock gating circuitry 58 propagating the clock 54 as the internal clock 62 for a number of cycles of the raw clock. For instance, the keep awake circuitry 60 may include a number of phase shifters configured to shift a number of overlapping signals out from a single signal. The multiple phases may be combined together such that they work together to keep propagation active while any of the phases are asserted. Thus, the number of phases and/or width of the original signal may control how long the propagation is held active. Additionally or alternatively to the phase shifting mechanism, the keep awake circuitry 60 may include a counter configured to count a number of cycles of the raw clock that causes the keep awake circuitry 60 to stop propagation of the internal clock 62 after a threshold number of cycles has been reached.

Regardless of the mechanism used to keep propagation active for the period of time, the period of time may be set to be sufficient for a command to be decoded in a burst command decoder/shifter-pipeline 64 from command bits 66 and for a maintain signal 68 to return to the clock gating circuitry 58 from the burst command decoder/shifter pipeline 64 based on the decoded command bits 66. The maintain signal 68 enables the burst command operations to continue using the burst clock past the default period of time. The burst command decoder/shifter pipeline 64 may include latency shifters to shift the command, the command bus 34, and/or the command decoder 32. The command bits 66 may be a portion of the command/address bits received at the memory device 10 from a host processor. Once the command has been decoded and entered into the burst command shifter pipeline 64, the burst command decoder/shifter pipeline 64 may return a maintain signal 68 when the decoded command is a burst command that utilizes a burst clock. However, the maintain signal 68 may take a relatively long time (e.g., 7-10 clock cycles) to be transmitted back to the clock gating circuitry 58 requiring the keep awake circuitry 60 to keep the internal clock 62 propagating by default for a duration in which the maintain signal 68 could possibly be received even for non-burst commands. This long propagation may be due to the period of time needed to decode the entire command, various complicating modes for the memory device 10 (e.g., power down or gear down modes) delaying decoding, and the like.

As illustrated, the clock control circuitry 50 may not differentiate between burst commands and non-burst commands. FIG. 3 is a timing diagram 80 of signals that may be present in the clock control circuitry 50 regardless of whether a received command is a burst command or a non-burst command. The timing diagram 80 includes a line 82 corresponding to the wake signal 56 and a line 84 corresponding to the clock 54. The timing diagram 80 also includes repeated signals 86, 88, 90, and 92 generated from a single signal (e.g., the wake signal 56) using phase shifting. In the illustrated embodiment, additional repeated signals are omitted for simplicity. Each of the repeated signals 86, 88, 90, and 92 (and any other similarly generated signals) are combined together to form a gate signal, illustrated by the line 94, that is used by the clock gating circuitry 58 to enable propagation of the internal clock 62, corresponding to a line 96, for a specific time after a pulse of the wake signal 56. For example, the gate signal may be applied to a gate of a transistor in the clock gating circuitry 58. The combined signals are used to stretch the pulse of the wake signal 56 for a duration long enough to ensure that the maintain signal 68 can be received back from the burst command decoder/shifter pipeline 64 before ceasing propagation. However, as previously noted, this extended period may cause the memory device 10 to consume power propagating the internal clock 62 even for non-burst commands where such propagation is unnecessary.

Instead, continuing propagation after a wake signal 56 may be performed in two steps: a shortened default duration and a second stage extended duration. The default may be shorter than the time necessary to receive the maintain signal 68 from the burst command decoder/shifter pipeline 64 by determining whether the command is a burst command using only a portion of the command (e.g., 1 of 2 cycles). The portion of the command may be examined for a particular pattern before the entire command is decoded and propagated through the burst command decoder/shifter pipeline 64.

For some types of memory devices 10, such as DDR5 devices, burst commands or non-burst commands may have a common pattern for a portion of the bits for non-burst commands. For example, a non-burst command sequence may include only non-burst commands (e.g., activate and precharge commands) used to satisfy row active time (tRAS) and row precharge time (tRP) for the memory device 10. When these non-burst commands are received, the memory device 10 does not necessarily need to propagate the internal clock 62 until the maintain signal 68 is received. Accordingly, when a non-burst pattern corresponding to non-burst commands is recognized in the portion of the bits, the memory device 10 may distinguish between burst and non-burst commands to cut off the propagation of the internal clock more quickly for non-burst commands than for burst commands. This cut off may be performed without waiting for the maintain signal 68 and/or before full decoding of a potential command in the burst command decoder/shifter pipeline 64 to increase power efficiency for the memory device 10.

Additionally or alternatively to identifying a pattern of non-burst commands, the memory device 10 may identify a burst pattern from a portion (e.g., a first cycle of a multi-cycle command) of the command corresponding to a group of commands potentially having at least one burst pattern command. Indeed, in some embodiments, at least one non-burst command (e.g., a mode register write) may be included in the group and flagged as potentially a burst command causing the memory device 10 to propagate the internal clock 62 for the non-burst commands. However, if at least some patterns (e.g., high then low bit pattern) for the portion may identify only non-burst commands, power efficiency may still be enhanced for the memory device 10 due to at least some non-burst commands having a reduced number of default cycles (e.g., 3 cycles rather than the default 7-10 cycles) of the internal clock 62 propagated after a pulse of a wake signal 56 is received by the memory device 10. In fact, some such operations of non-burst commands sharing a pattern of the portion with burst commands may be grouped such that rare operations are included in such groups to reduce the number of occurrences of non-burst commands having the internal clock 62 propagated until the maintain signal 68 is received back at the clock gating circuitry 58.

Figure 4:
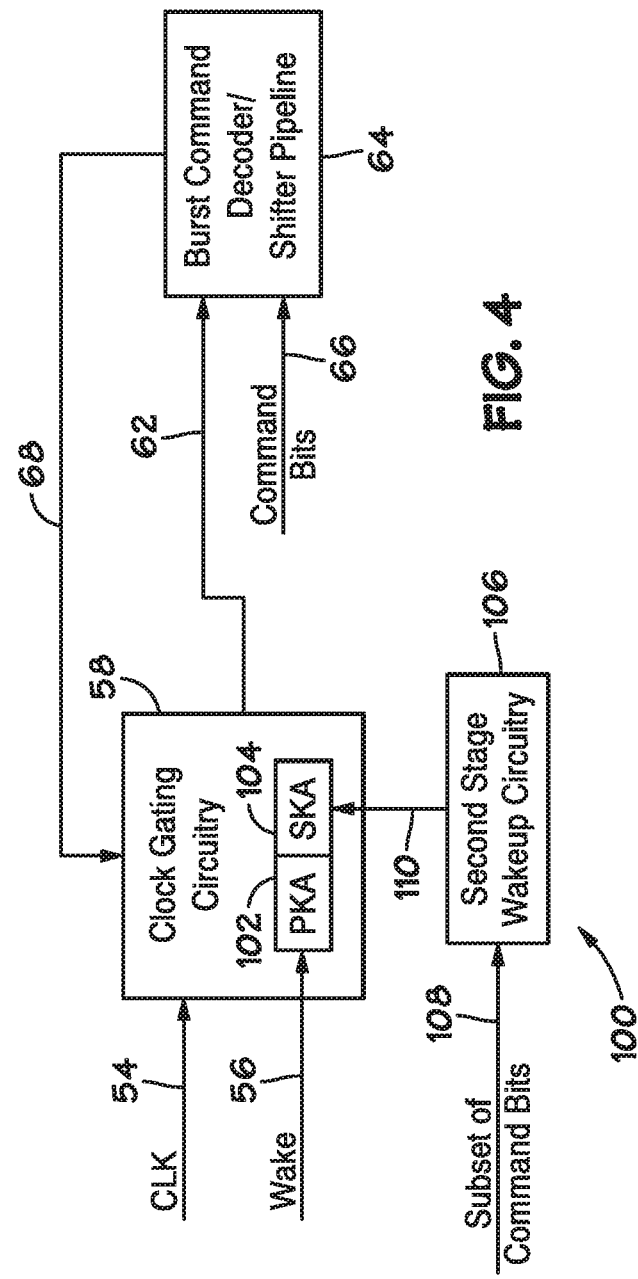
FIG. 4 is a block diagram view of clock circuitry used to gate a burst clock in the memory device of FIG. 1 using a partial command decode, according to an embodiment of the present disclosure.

FIG. 4 is a block diagram of clock control circuitry 100 that utilizes a two-part keep awake scheme for propagating the internal clock 62 to reduce propagation of the internal clock for at least some non-burst commands received at the memory device 10. As illustrated, the clock control circuitry 100 is similar to the clock control circuitry 50 except that the clock control circuitry 100 utilizes a primary keep awake circuitry (PKA) 102 and a secondary keep awake circuitry (SKA) 104 rather than a solitary keep awake circuitry 60 based on the wake signal 56 alone. Specifically, the PKA 102 and the SKA 104 may be used to stretch the wake signal 56 using any of the techniques discussed in relation to the keep awake circuitry 60. The PKA 102 receives the wake signal 56 and keeps the internal clock 62 propagating for a default amount of time (e.g., 3 cycles of the clock 54). For instance, the wake signal 56 may be stretched by the PKA 102 to keep the internal clock 62 propagating for a default period of time. However, unlike the keep awake circuitry 60, the default amount of time that the PKA 102 keeps the internal clock 62 propagating after receiving the wake signal 56 is less than an amount of time (e.g., 7 to 10 cycles of the clock 54) sufficient to enable the burst command decoder/shifter pipeline 64 to decode the command and return the maintain signal 68.

During the time that the PKA 102 keeps the clock propagating after receiving the wake signal 56, second stage wakeup circuitry 106 may receive a subset of the command bits 108. The subset may be a portion (e.g., a first cycle having two bits (b01)) of the command/address bits (e.g., having 14 bits) received at the command interface 14. The second stage wakeup circuitry 106 may identify whether only non-burst commands have a pattern found in the portion or whether any burst commands have the pattern found in the portion. If only non-burst commands have the pattern. This pattern matching may be done without full decoding since this determination may be made without knowing whether power down or gear down modes are activated for the memory device 10 enabling determining whether to stretch the wake signal 56 for a duration sufficient to enable the burst command decoder/shifter pipeline 64 to decode the command and return the maintain signal 68.

When the pattern in the subset of command bits 108 matches burst commands (e.g., is not just non-burst commands), the second stage wakeup circuitry 106 transmits a second stage wakeup signal 110 to the SKA 104 that stretches the wake signal 56 beyond the stretching performed using the PKA 102 based on an assertion of the second stage wakeup signal 110. Alternatively, the second stage wakeup circuitry 106 may default to stretching the wake signal 56 to the longer duration via the SKA 104 unless the pattern matches no burst command patterns causing the assertion of the second stage wakeup signal 110 to cause the SKA 104 to disable stretching the wake signal 56 to the longer duration.

As noted above, the clock gating circuitry 100 may distinguish between burst and non-burst commands for determining how long to stretch the wake signal 56. FIG. 5 is a timing diagram 120 where the clock gating circuitry 100 stretches the wake signal 56 for a non-burst command. The timing diagram 80 includes a line 122 corresponding to the wake signal 56 and a line 124 corresponding to the clock 54. The timing diagram 120 also includes a line corresponding to the non-burst command. The timing diagram 120 further includes a line 128 corresponding to the internal clock 62. As illustrated, the internal clock 62 is propagated for three cycles. However, this duration may be any suitable duration that is shorter than is necessary to enable the burst command decoder/shifter pipeline 64 to decode the command and return the maintain signal 68. Instead, this duration may be set to a shorter duration that is sufficient to ensure that the non-burst write command is latched to have its corresponding function completed. Using the shorter duration may improve power efficiency due to the reduction in cycles. For example, a reduction in propagated cycles from 7-10 cycles to 3 cycles may reduce the number of propagated clock cycles by more than 50% resulting in a corresponding savings in power efficiency.

FIG. 6 is a timing diagram 140 where the clock gating circuitry 100 stretches the wake signal 56 for one or more burst commands. The timing diagram 140 includes a line 142 corresponding to the wake signal 56 and a line 144 corresponding to the clock 54. The timing diagram 140 also includes repeated signals 146, 148, and 150 generated from a single signal (e.g., the wake signal 56) using phase shifting. In the illustrated embodiment, additional repeated signals are omitted for simplicity. Each of the repeated signals 146, 148, and 150 (and any other similarly generated signals) are combined together to form at least a portion of a gate signal, that is used by the clock gating circuitry 58 to enable propagation of the internal clock 62 for a specific time after a pulse of the wake signal 56. In other words, the combined signals are used to stretch the pulse of the wake signal 56 as the gate signal for a default duration suitable for burst and non-burst commands. When the SKA 104 determines that an extended duration should be used where the extended duration is long enough to ensure that the maintain signal 68 is able to be received back from the burst command decoder/shifter pipeline 64 before ceasing propagation of the internal clock 62. In such an event, the SKA 104 may output a pulse, corresponding to lie 152, configured to extend propagation for the extended duration. The extended duration signal and the default signal may be combined and applied as the gate signal. The gate signal may have a first portion (e.g., first 3 clock cycles) that is generated using stretching in the PKA 102 and a second portion (e.g., subsequent 4-7 clock cycles) that is generated using stretching in the SKA 104. In other words, the clock gating circuitry 100 may stretch the wake signal 56 for a duration of the first portion for all commands and stretch the wake signal 56 to a duration including the second portion when a pattern matches at least some burst commands to ensure that burst commands are handled properly. The timing diagram 140 shows a "gapless" burst operation where the maintain signal 68 corresponding to a line 154 returning from the decoder/shifter pipeline 64 is high throughout the length of the burst, thus maintaining a continuous train of clock pulses on the line 156.

In FIGS. 3 and 5, a single pulse of the wake signal 56 is received. However, FIG. 6 shows multiple pulses of the wake signal 56 corresponding to consecutive commands. In some embodiments, the commands may be received at or below some frequency (e.g., every 8 clock cycles). Commands spaced by this minimum distance may be referred to as gapless bursts with no gaps between commands. As illustrated, due to gapless bursts, the maintain signal 68 and the pulses 158, 160, 162, 164, 166, and 168 cause the gate clocking circuitry 100 to create a continuous enable envelope where the internal clock 62 runs without interruption through the longer durations using the SKA 104 for each pulse 158, 160, 162, 164, 166, and 168. As may be understood, the maintain signal 68 may be de-asserted after some duration passes after receiving and decoding a command and/or performing a corresponding function. However, the pulses 158, 160, 162, 164, 166, and 168 may occur more after a previous pulse before this duration lapses causing the maintain signal 68 to remain asserted keeping the gapless operation intact. In other words, the power savings achieved for non-burst commands may cause little to no changes to the operation of the burst commands.

Furthermore, although some embodiments of the memory device 10, such as DDR5, may have specified special power down modes where non-target command functionality/on-die termination is maintained during the power down. In these modes or other modes, certain command/address input buffers (e.g., CA<1>) may be disabled. If the disabled command/address input buffers are used for the reduced command decode techniques discussed herein, the second stage wakeup circuitry 106 may cause all pulses of the wake signal 56 to be stretched to the longer duration since such reduced command decoding may be blocked during such modes.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
 a command input configured to receive a command;
 second stage wakeup circuitry configured to receive a portion of the command and output an indication of whether the command is a non-burst command based on the portion; and
 clock gating circuitry configured to:
  receive an input clock;
  receive a wake signal;
  output an internal clock based at least in part on a pulse of the received wake signal; and
  maintain the output of the internal clock for a duration based on the indication, wherein the duration is shorter when the indication indicates that the command is a non-burst command.

2. The semiconductor device of claim 1, wherein the indication that the command is a non-burst command comprises the portion having a pattern that designates only non-burst commands.

3. The semiconductor device of claim 1, wherein the portion comprises only a subset of the command, and wherein the indication that the command is a non-burst command comprises the portion having a pattern found in non-burst commands.

4. The semiconductor device of claim 3, wherein the command spans multiple cycles, and the subset comprises only a first cycle of the command.

5. The semiconductor device of claim 4, wherein the clock gating circuitry outputs the indication of the pattern without regard to modes of the semiconductor device that may be used in determining how to decode the command.

6. The semiconductor device of claim 5, wherein the indication is output after a first number of cycles of the input clock after receiving a pulse of the wake signal, and wherein the clock gating circuitry is able to receive a maintain signal based on decoding of the command after a second number of cycles of the input clock after the pulse of the wake signal, wherein the first number is smaller than the second number.

7. The semiconductor device of claim 6, wherein the first number is less than half of the second number.

8. The semiconductor device of claim 1, wherein the clock gating circuitry is configured to maintain the output of the input clock by stretching a pulse of the wake signal by phase shifting multiple signals from the wake signal and combining the multiple signals together to generate a gating signal used to control whether the internal clock is output from the clock gating circuitry.

9. The semiconductor device of claim 1, wherein the clock gating circuitry is configured to maintain the output of the input clock by counting a number of cycles for the input clock to be maintained based on the indication.

10. The semiconductor device of claim 1, comprising a command shifter pipeline configured to decode the command.

11. The semiconductor device of claim 10, wherein the clock gating circuitry is configured to receive a maintain signal from the command shifter pipeline based on the decoded command being a burst command.

12. The semiconductor device of claim 11, wherein the duration ends before the command shifter pipeline can transmit the maintain signal to the clock gating circuitry when the indication indicates that the command is a non-burst command.

13. The semiconductor device of claim 12, wherein the duration ends after the command shifter pipeline transmits the maintain signal to the clock gating circuitry when the indication does not indicate that the command is a non-burst command.

14. A method, comprising:
 receiving, at a memory device, an input clock;
 receiving, at the memory device, a wake signal;
 receiving, at the memory device, a command;
 determining, from a portion of the command, whether the portion indicates that the command is one of a plurality of non-burst commands; and
 outputting an internal clock for a duration based on the determination of whether the command is one of the plurality of non-burst commands, wherein the duration has a first length when the command is one of the plurality of non-burst commands and has a second length when the command is not one of the plurality of non-burst commands.

15. The method of claim 14, wherein the plurality of non-burst commands comprises burst commands having a similar pattern of one or more bits for the portion of the command.

16. The method of claim 15, wherein the one or more bits comprises two bits for a first cycle of the command, wherein the command spans multiple cycles of the input clock.

17. The method of claim 14, wherein the wake signal comprises a chip select signal received from a host device.

18. A memory device, comprising:
 a first input configured to receive an input clock at the memory device;
 a second input configured to receive a command at the memory device;
 a third input configured to receive a wake signal at the memory device; and
 clock control circuitry configured to control propagation of the input clock within the memory device as an internal clock, wherein the clock control circuitry comprises:
  primary keep awake circuitry configured to receive the wake signal and propagate the internal clock for a default number of cycles;
  a second stage wakeup circuitry configured to receive a subset of the command and output a second stage wakeup signal based on the subset; and
  secondary keep awake circuitry configured to receive the second stage wakeup signal and propagate the internal clock for an extended number of cycles after the propagation of the default number of cycles.

19. The memory device of claim 18, wherein second stage wakeup signal is based on the subset having a pattern that does not correspond to any burst command codes.

20. The memory device of claim 19, comprising a command decoder that is configured to:
 receive the command;
 decode the command; and
 transmit a maintain signal to the clock control signal to maintain propagation of the internal clock based on the decoded command being a burst command, wherein the clock control circuitry is configured to receive the maintain signal during the propagation of the internal clock using the extended number of cycles.

* * * * *